United States Patent
Nishiura et al.

(10) Patent No.: US 12,554,253 B2
(45) Date of Patent: Feb. 17, 2026

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Susumu Nishiura, Toyama (JP); Kenichi Maeda, Toyama (JP); Hiroyuki Kitamoto, Toyama (JP); Hajime Abiko, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 527 days.

(21) Appl. No.: 17/484,183

(22) Filed: Sep. 24, 2021

(65) Prior Publication Data

US 2022/0100176 A1 Mar. 31, 2022

(30) Foreign Application Priority Data

Sep. 29, 2020 (JP) .................. 2020-162999

(51) Int. Cl.
*H01L 21/66* (2006.01)
*G01V 1/01* (2024.01)
(Continued)

(52) U.S. Cl.
CPC .......... *G05B 19/4189* (2013.01); *G01V 1/01* (2024.01); *H01L 21/67739* (2013.01);
(Continued)

(58) Field of Classification Search
CPC .......... H01L 22/26; G05B 2219/37634; G05B 2219/50198
See application file for complete search history.

(56) References Cited

U.S. PATENT DOCUMENTS

2003/0068219 A1* 4/2003 Boonstra ........... H01L 21/67303
414/935
2009/0143876 A1* 6/2009 Sugawara ......... H01L 21/67109
700/79
(Continued)

FOREIGN PATENT DOCUMENTS

CN 101447404 A 6/2009
CN 114121816 A * 3/2022 ............. H10B 12/03
(Continued)

OTHER PUBLICATIONS

Chinese Office Action issued on Oct. 26, 2024 for Chinese Patent Application No. 202111054633.7.
(Continued)

*Primary Examiner* — Edward Chin
(74) *Attorney, Agent, or Firm* — Volpe Koenig (57) ABSTRACT

There is provided a configuration that includes: at least one transfer mechanism configured to transfer a substrate and at least one processing mechanism configured to process the substrate; an earthquake detector configured to detect an earthquake; and a controller configured to control the at least one transfer mechanism and the at least one processing mechanism according to a detection result of the earthquake detector, wherein the controller is configured to be capable of performing a stopping operation of the at least one transfer mechanism according to a P wave (initial tremor wave) and an S wave (principal fluctuation wave).

16 Claims, 5 Drawing Sheets

| Set value | Stopping method | Details |
|---|---|---|
| 0 | No stopping | |
| 1 | Deceleration stop | Stop simply and fast |
| 2 | Immediate stop | Stop as fast as possible |
| 3 | Step stop | Stop after end of single axis operation |
| 4 | Cycle stop | Stop after end of one unit operation |

(51) Int. Cl.
*G05B 19/418* (2006.01)
*H01L 21/677* (2006.01)
(52) U.S. Cl.
CPC .... *H01L 22/20* (2013.01); *G05B 2219/45031* (2013.01); *G05B 2219/50365* (2013.01)

(56) References Cited

U.S. PATENT DOCUMENTS

| | | | | |
|---|---|---|---|---|
| 2010/0259296 | A1* | 10/2010 | Or-Bach | H03K 19/17748 326/38 |
| 2018/0166320 | A1* | 6/2018 | Kim | H10D 1/716 |
| 2018/0190804 | A1* | 7/2018 | Chui | H10D 64/311 |
| 2019/0067336 | A1* | 2/2019 | Yamazaki | H10D 86/443 |
| 2021/0280700 | A1* | 9/2021 | Wernersson | H10D 30/43 |
| 2022/0005809 | A1* | 1/2022 | Kim | H10B 12/482 |
| 2022/0068859 | A1* | 3/2022 | Choi | H10B 12/05 |
| 2023/0247840 | A1* | 8/2023 | Im | H10D 30/701 257/295 |

FOREIGN PATENT DOCUMENTS

| | | |
|---|---|---|
| JP | 08-146843 A | 6/1996 |
| JP | 2001-223173 A | 8/2001 |
| JP | 2005-346003 A | 12/2005 |
| JP | 2007-108012 A | 4/2007 |
| JP | 2007-314262 A | 12/2007 |
| JP | 2008-218508 A | 9/2008 |
| JP | 2009-152549 A | 7/2009 |
| JP | 2010-027781 A | 2/2010 |
| KR | 10-2009-0056880 A | 6/2009 |
| KR | 10-2019-0051796 A | 5/2019 |
| TW | 200947584 A | 11/2009 |
| WO | 2011/016132 A1 | 2/2011 |

OTHER PUBLICATIONS

Japanese Office Action issued on Apr. 12, 2022 for Japanese Patent Application No. 2020-162999.
Korean Office Action issued on Jul. 18, 2023 for Korean Patent Application No. 10-2021-0126842.
Korean Office Action issued on Dec. 20, 2023 for Korean Patent Application No. 10-2021-0126842.
Taiwan Office Action issued on Nov. 4, 2022 for Taiwan Patent Application No. 110132955.
Japanese Office Action issued on Aug. 23, 2022 for Japanese Patent Application No. 2020-162999.

* cited by examiner

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2020-162999, filed on Sep. 29, 2020, the entire contents of which are incorporated herein by reference.

TECHNICAL FIELD

The present disclosure relates to a technique of stopping a substrate processing apparatus when an earthquake occurs.

BACKGROUND

In the related art, as an earthquake countermeasure in a substrate processing apparatus, a configuration is disclosed in which a boat fall prevention pin and a boat fall prevention wall are arranged to prevent a boat from falling in the event of an earthquake.

However, in the substrate processing apparatus in the related art, since a person may determine whether to perform a transfer stop process and press a transfer stop button, a transfer mechanism may not be stopped in a case where there is no person near the apparatus when an earthquake occurs.

SUMMARY

Some embodiments of the present disclosure provide a technique capable of detecting vibrations of an initial tremor (P) wave and a principal fluctuation (S) wave in the event of an earthquake, to perform an appropriate transfer stopping operation.

According to embodiments of the present disclosure, there is provided a configuration that includes: at least one transfer mechanism configured to transfer a substrate and at least one processing mechanism configured to process the substrate; an earthquake detector configured to detect an earthquake; and a controller configured to control the at least one transfer mechanism and the at least one processing mechanism according to a detection result of the earthquake detector, wherein the controller is configured to be capable of performing a stopping operation of the at least one transfer mechanism according to a P wave (initial tremor wave) and an S wave (principal fluctuation wave).

DETAILED DESCRIPTION

Figure 1:
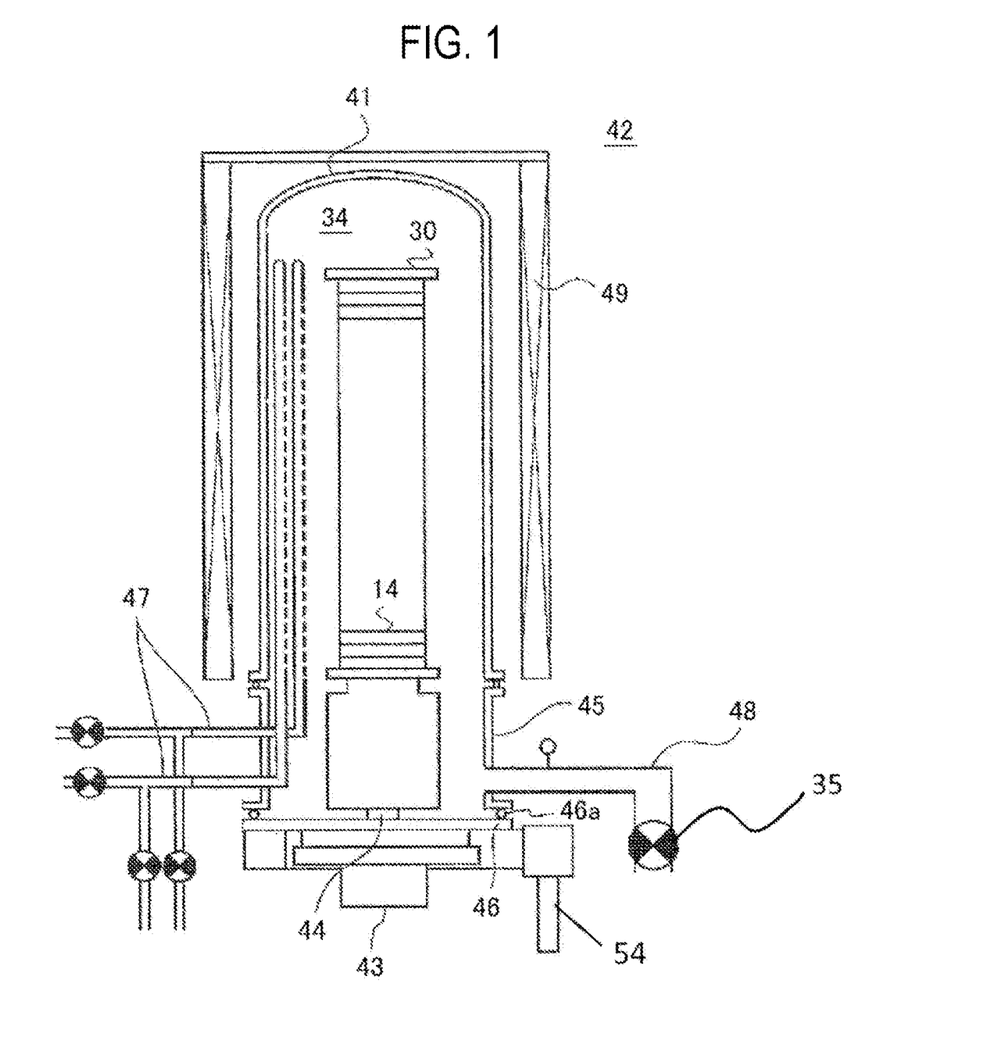
FIG. 1 is a view showing a configuration of a process furnace 1 of a substrate processing apparatus according to embodiments of the present disclosure.

Embodiments of the present disclosure will be described with reference to FIGS. 1 and 2. Here, drawings used in the following description are schematic, and dimensional relationships, ratios, and the like of the respective elements shown in the drawings may not match actual ones. Further, the dimensional relationships, ratios, and the like of the respective elements among plural drawings may not match each other.

In the present disclosure, a transfer mechanism is a general term for an elevator (elevating mechanism), a loader, a transfer mechanism, and the like and corresponds to, for example, a pod conveyor 20, a substrate conveyor 28, a boat elevator 54, a rotator 43, and the like, as described below. A processing mechanism is a general term for a gas supply system, an exhaust system, a heating unit, and the like and corresponds to a MFC, an opening/closing valve AV, an APC valve 35, a vacuum pump, a heater unit 49, and the like. Transfer stop means stopping at least a part of the transfer mechanism. Processing stop means stopping at least a part of the processing mechanism.

(Process Furnace)

The process furnace 42 includes a reaction tube 41. The reaction tube 41 is made of, for example, a non-metallic material having heat-resistance, such as quartz ($SiO_2$) or silicon carbide (SiC), and has a cylindrical shape with its upper end closed and its lower end opened.

A process chamber 34 is formed inside the reaction tube 41. A boat 30 serving as a substrate holder is inserted into the process chamber 34 from below and is configured to be accommodated in the process chamber 34 in such a state that wafers 14 held in a horizontal posture by the boat 30 are arranged in multiple stages in a vertical direction. The boat 30 accommodated in the process chamber 34 is configured to be rotatable in a state where a plurality of wafers 14 are mounted while maintaining an airtightness of the process chamber 34, by rotating a rotary shaft 44 by the rotator 43.

A manifold 45 is disposed to be concentric with the reaction tube 41 under the reaction tube 41. The manifold 45 is made of, for example, a metal material such as stainless steel and has a cylindrical shape with both of its upper and lower ends opened. The reaction tube 41 is vertically supported by the manifold 45 from the lower end side. That is, the reaction tube 41 forming the process chamber 34 is installed in the vertical direction via the manifold 45 to form the process furnace 42. The lower end of the manifold 45 is configured to be hermetically sealed by a seal cap 46 when the boat elevator 54 is raised. A seal 46a such as an O-ring configured to air-tightly seal the process chamber 34 is installed between the lower end of the manifold 45 and the seal cap 46.

Further, a gas introduction pipe 47 configured to introduce a precursor gas, a purge gas, and the like into the process chamber 34, and an exhaust pipe 48 configured to exhaust a gas in the process chamber 34 are respectively connected to the manifold 45. A pressure of the process chamber 34 is controlled while the APC valve 35 is being regulated based on a detection result of a pressure sensor (not shown).

A heater unit 49 serving as a heating means (heating mechanism) is disposed to be concentric with the reaction tube 41 on the outer circumference of the reaction tube 41. The heater unit 49 is configured to heat the process chamber 34 such that an entirety of the process chamber 34 has a uniform or predetermined temperature distribution.

Next, as a process of manufacturing a semiconductor device, an operation procedure when processing the wafer 14 by using the substrate processing apparatus according to the embodiments of the present disclosure will be described.

(Pod Transfer Process)

When processing the wafer 14 with the substrate processing apparatus, first, a carrier (hereinafter, referred to as a pod) accommodating a plurality of wafers 14 is placed on a pod stage. Then, the pod is transferred from the pod stage to a pod shelf by the pod conveyor 20.

(Wafer Supply Process)

Thereafter, the pod conveyor 20 transfers the pod placed on the pod shelf to a pod opener. Then, a lid of the pod is opened by the pod opener, and the number of wafers 14 accommodated in the pod is detected by a number-of-substrate detector.

(Transfer Process Before Loading)

After opening the lid of the pod, the substrate conveyor 28 disposed in a transfer chamber discharges the wafer 14 from the pod. Then, the unprocessed wafer 14 discharged from the pod is transferred to the boat 30 located in the transfer chamber, like the substrate conveyor 28. That is, the substrate conveyor 28 performs a wafer charging operation in the transfer chamber such that the unprocessed wafer 14 is charged into the boat 30 before the boat 30 is loaded into the process chamber 34. Thus, the boat 30 holds the plurality of wafers 14 in a stacked state where the wafers 14 are spaced apart from each other in the vertical direction.

(Loading Process)

After the wafer charging operation, the boat 30 holding the plurality of unprocessed wafers 14 is loaded into the process chamber 34 by the elevating operation of the boat elevator 54 (boat loading). That is, the boat elevator 54 is operated to load the boat 30 holding the unprocessed wafers 14 from the transfer chamber into the process chamber 34. Thus, the seal cap 46 seals the lower end of the manifold 45 via the seal 46a.

(Processing Process)

After the boat loading, a predetermined process is performed on the unprocessed wafers 14 held by the boat 30 loaded into the process chamber 34. Specifically, for example, in a case of performing a film-forming process by a thermal CVD reaction, exhaust is performed by using the exhaust pipe 48, and the APC valve 35 is regulated such that the inside of the process chamber 34 has a desired pressure (vacuum degree). Then, the process chamber 34 is heated by using the heater unit 49 and is maintained at a desired temperature, and the rotator 43 is operated to rotate the boat 30, and the wafers 14 are also rotated accordingly. The rotation of the wafer 14 continues until the wafers 14 are unloaded, as described below. Further, by supplying the precursor gas, the purge gas, and the like to the process chamber 34 via the gas introduction pipe 47, a thin film is formed on a surface of the wafer 14 held by the boat 30 by using a decomposition reaction by heat or the like.

After forming the thin film on the surface of the wafer 14, the heating by the heater unit 49 is stopped to lower the temperature of the processed wafers 14 to a predetermined temperature. Then, when a preset time elapses, the gas supply into the process chamber 34 is stopped, and the supply of an inert gas into the process chamber 34 is started. Thus, the process chamber 34 is substituted with the inert gas, and an internal pressure of the process chamber 34 is returned to the atmospheric pressure.

(Unloading Process)

Thereafter, by the elevating operation of the boat elevator 54, the seal cap 46 is lowered to open the lower end of the manifold 45, and the boat 30 holding the processed wafers 14 is unloaded from the lower end of the manifold 45 to the outside of the process chamber 34 (boat unloading).

(Transfer Process After Unloading)

After the wafers 14 of the boat 30 that have been standing by are cooled to a predetermined temperature (for example, about room temperature), the substrate conveyor 28 disposed in the transfer chamber removes the wafers 14 from the boat 30. Then, a wafer discharge operation of transferring the removed processed wafers 14 from the boat 30 to an empty pod placed on the pod opener and accommodating the same in the empty pod is performed. Thereafter, the pod accommodating the processed wafers 14 is transferred to the pod shelf or the pod stage by the pod conveyor 20. In this way, a series of processing operations of the substrate processing by the substrate processing apparatus are completed.

The substrate processing process may not be limited to a form including the above-described seven processes. For example, the above-described load process, processing process, and unloading process may be set as the substrate processing process, and the above-described pod transfer process, wafer supply process, and transfer process before loading, and transfer process after unloading may be set as the substrate transfer process.

Figure 2:
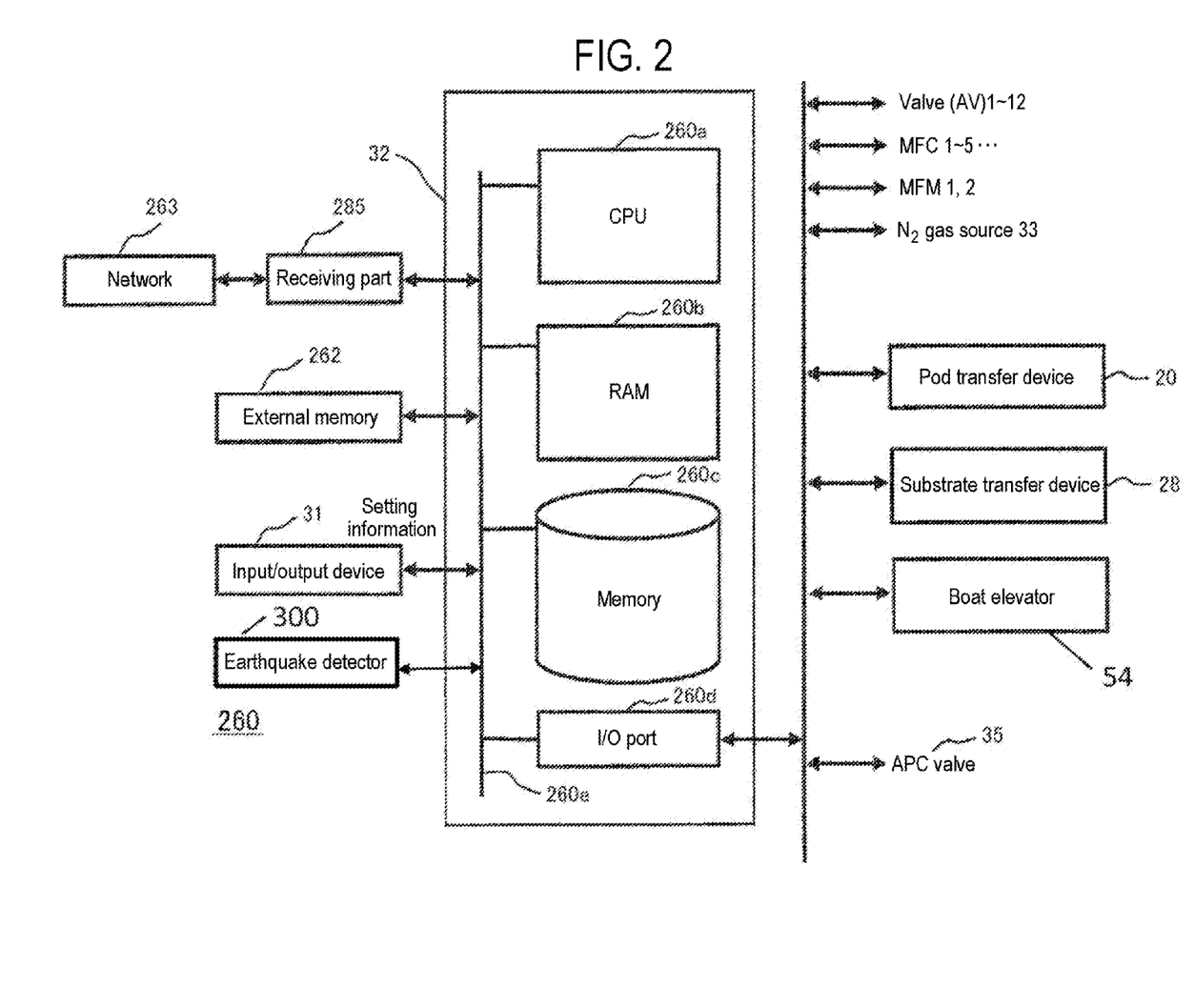
FIG. 2 is a diagram showing a configuration example of a control system including an input/output device and a controller of a substrate processing apparatus according to embodiments of the present disclosure.

As shown in FIG. 2, a controller 260 is configured to include at least an input/output device 31 as a main operation module configured to input setting information, and a control part 32 as a control module.

The control part 32 is configured as a computer including a CPU (Central Processing Unit) 260a, a RAM (Random Access Memory) 260b, a memory 260c, and an I/O port 260d. The RAM 260b, the memory 260c, and the I/O port 260d are configured to be capable of exchanging data with the CPU 260a via an internal bus 260e.

The CPU 260a serving as an arithmetic part is configured to read and execute a control program from the memory 260c and is also configured to read a file from the memory 260c according to an input of an operation command from the input/output device 31. Further, the CPU 260a is configured to be capable of calculating arithmetic data by comparing/calculating a set value input from a receiving part 285 with a file or control data stored in the memory 260c. Further, the RAM 260b is configured as a memory area (work area) in which a program, arithmetic data, processing data, and the like read by the CPU 260a are temporarily held.

The memory 260c includes, for example, a flash memory, a hard disk drive (HDD), or the like. A control program that controls operations of a substrate processing apparatus, screen files such as an editing screen for recipe editing and a setting screen for setup, various files including a process recipe in which sequences and conditions of substrate processing are written, a recipe for transferring a substrate, and the like, data detected from each sensor, and the like are included in the memory 260c, and arithmetic data, processing data, and the like generated until the process of setting the process recipe used when processing the wafer 14 are readably stored in the memory 260c.

An editing screen used in creating the process recipe is displayed on the operation screen of the input/output device 31. For example, the input/output device 31 configured as a touch panel or the like is configured such that an external memory 262 may be connected to the input/output device 31. Further, the controller 260 is configured such that a network 263 may be connected to the controller 260 via the receiving part 285. This means that the controller 260 may be connected to a host device such as a host computer existing on the network 263, and further to an earthquake detector 300 and the like to be described below. Therefore, when the input/output device 31 exists on the network 263, the input/output device 31 may be connected to the controller 260. That is, the input/output device 31 is not limited to that in the above-described embodiments but may be spaced apart from the substrate processing apparatus.

Hereinafter, each file including this process recipe, control program, and the like may be collectively and simply referred to as a program. When the term "program" is used in the present disclosure, it may include a case of including the process recipe solely, a case of including the control program solely, or a case of including both.

The controller 260 is not limited to a case where the controller 260 is configured as a dedicated computer, but may be configured as a general-purpose computer. For example, the controller 260 according to the embodiments may be configured by providing an external memory (for example, a semiconductor memory such as a USB memory) 262 that stores the above-mentioned program and installing the program on the general-purpose computer by using the external memory 262.

The means to supply the program to the computer is not limited to the case of supplying the program via the external memory 262. For example, the program may be supplied to the computer by using communication means such as the network 263 (the Internet or a dedicated line), instead of using the external memory 262.

Further, the memory 260c and the external memory 262 are configured as a computer-readable recording medium. Hereinafter, these are collectively and simply referred to as a recording medium. When the term "recording medium" is used in the present disclosure, it may include a case of including the memory 260c solely, a case of including the external memory 262 solely, or a case of including both.

Subsequently, in the above-described substrate processing apparatus, a stop process of the substrate processing apparatus when an earthquake occurs will be described. When receiving the detection signal from the earthquake detector 300, the control part 32 of the substrate processing apparatus is configured to control stopping operations of the transfer mechanism and the processing mechanism according to the detection signal of each of the initial tremor (P) wave and the principal fluctuation (S) wave. For example, when an earthquake occurs, when the detection signal of the initial tremor (P) wave and the principal fluctuation (S) wave is received from the earthquake detector 300, the transfer stopping operation of the transfer mechanism is performed.

Figure 7:
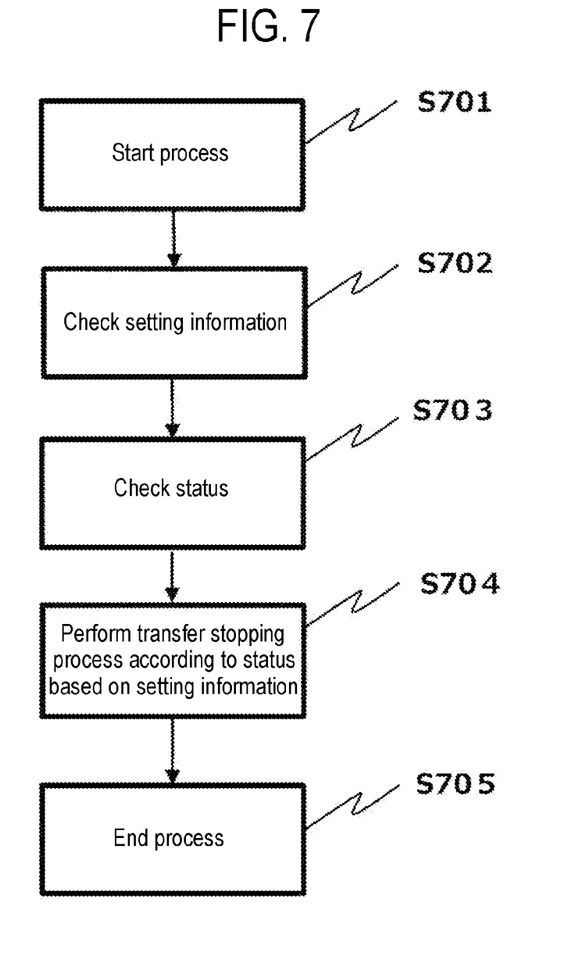
FIG. 7 is a flow chart in which a transfer mechanism is stopped in a substrate processing apparatus according to embodiments of the present disclosure when an earthquake is detected.

FIG. 7 is an example of a flow chart of the controller 260 when an earthquake detection signal is received from the earthquake detector 300. As shown in FIG. 7, when the operation stopping process is started (S701), setting information is checked (S702), a status is checked (S703), a transfer stopping process according to the status is performed based on the setting information (S704), and the process is ended (S705). At present, both the P wave and the S wave are shown in the same flow chart in FIG. 7, but the operation stopping process of the transfer mechanism may be individually set by the P wave and the S wave. Further, the controller 260 is configured to be capable of grasping whether a detected wave is the P wave or the S wave by a signal from the earthquake detector 300.

(S701) When the controller 260 acquires the earthquake detection signal from the earthquake detector 300, it starts the transfer stopping process of the transfer mechanism that is operating at the time of earthquake detection.

As the earthquake detector 300, for example, a general-purpose earthquake detector that can be set to output the detection signal of the P wave at an earthquake intensity of 5 gal and the detection signal of the S wave at the earthquake intensity of 25 gal or more (earthquake intensity of 4 or more) may be used. These numerical values may be set and changed by the input/output device 31 or the control part 32 of the substrate processing apparatus.

(S702) The controller 260 checks the transfer mechanism to be subjected to the transfer stopping process setting contents of the transfer mechanism.

Figure 3:
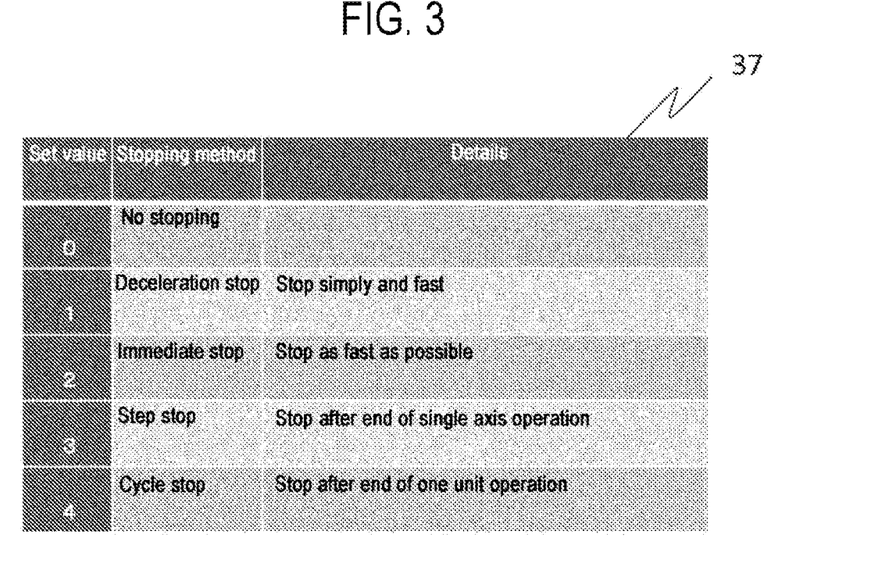
FIG. 3 is a diagram showing a list table of methods of stopping a substrate processing apparatus according to embodiments of the present disclosure.

For example, FIG. 3 is a diagram showing a table 37 showing a list of stopping methods of the transfer mechanism of the substrate processing apparatus. That is, the stopping method may be selected by designating one of four stopping methods including deceleration stop, immediate stop, step stop, and cycle stop as a set value. In a case where the transfer mechanism may operate without stopping even when an earthquake is detected, it is possible to continue the process by setting the set value to 0, which is described below in detail.

Figure 5:
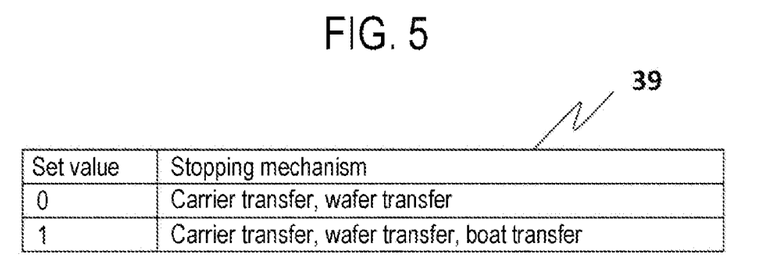
FIG. 5 is a diagram for setting a transfer mechanism to be stopped in a substrate processing apparatus according to embodiments of the present disclosure when an earthquake occurs.

FIG. 5 shows a table 39 to set the transfer mechanism to be stopped when the control part 32 of the substrate processing apparatus receives the P wave from the earthquake detector. Specifically, there are three types of substrate transfers, which include carrier transfer, wafer transfer, and boat transfer, and the table 39 is configured to set whether to stop the operation of the transfer mechanism that performs each transfer when an earthquake is detected (when the P wave is detected).

The carrier transfer indicates the pod conveyor 20 capable of transferring the pod accommodating the wafers 14 between the pod stage and the pod shelf, the wafer transfer indicates the substrate conveyor 28 capable of transferring an unprocessed wafer 14 discharged from the pod to the boat 30, and the boat transfer indicates the boat elevator 54 capable of loading the boat 30 holding a plurality of unprocessed wafers 14 into the process chamber 34 (boat loading) or unloading the boat 30 holding a plurality of processed wafers 14 from the process chamber 34 (boat unloading).

Here, in the case of the boat elevator (boat transfer) 54, the boat 30 is set to be moved to an initial position. In a case where the set value is set to 1 in the table of FIG. 5, when an earthquake (P wave) is detected while the boat 31 is operating (the boat 31 is being raised or being lowered), the boat elevator 54 is configured to return the boat 30 to its initial position in a case where the stopping method shown in FIG. 3 is set to "step stop."

Further, in a case where the set value is set to 0, the wafers 14 continue to be processed even though the earthquake is detected while the boat 31 is being raised, that is, during the boat loading. That is, the process is continued in a case where the earthquake is detected during the processing of the processing mechanism that processes substrates. As a result, in the case of a moderate earthquake (earthquake intensity of about 4 to 5) in which shaking is large but there is no risk of collapse, priority may be given to processing the wafers 14. For example, in an area where an occurrence rate of a large earthquake is extremely low, a set value of 0 may be selected to give priority to processing the wafers 14.

Figure 6:
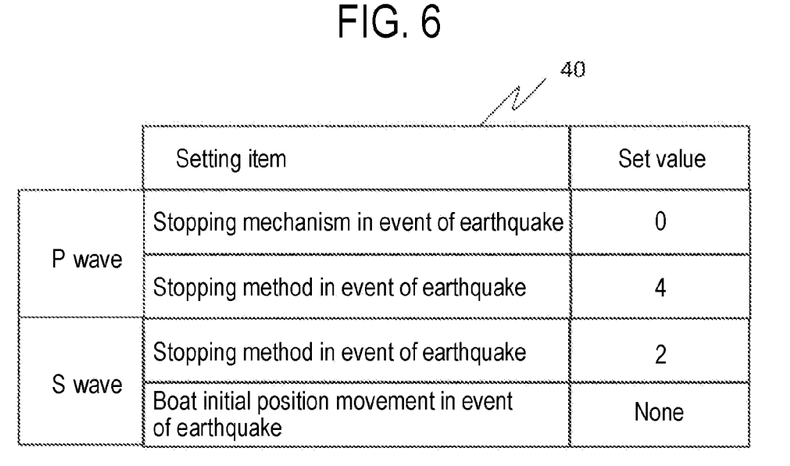
FIG. 6 shows an example of a setting screen to set a transfer mechanism for earthquake signal detection of a substrate processing apparatus according to embodiments of the present disclosure.

FIG. 6 shows an example of a setting screen 40 to stop the transfer mechanism when an earthquake is detected.

For example, the setting screen shown in FIG. 6 is displayed on the operation screen of the input/output device 31, and the stopping operation of the transfer mechanism is set with respect to the P wave and the S wave individually. In this way, the preset contents are stored in the memory 260c, and the setting information is read when an earthquake is detected.

(S703) The controller 260 checks an operating status of the transfer mechanism to be subjected to the transfer stopping process. That is, the controller 260 checks the operation status of each of the pod conveyor 20, the substrate conveyor 28, and the boat elevator 54 at the time of earthquake detection. When no transfer mechanism is operating, the controller 260 proceeds to (S705) and ends the transfer stopping process sequence. When any one of the transfer mechanisms is in operation, the controller 260 proceeds to (S704) and performs the transfer stopping process.

Figure 4:
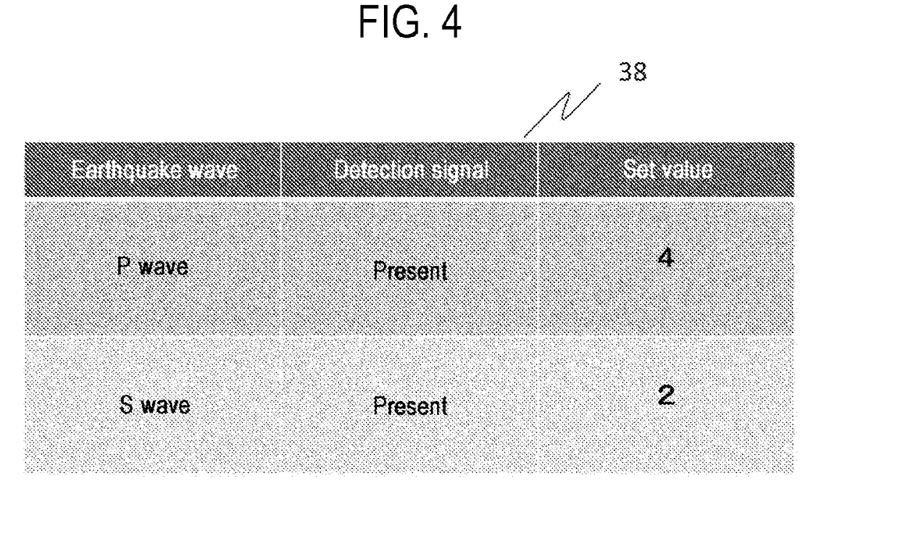
FIG. 4 is a diagram showing a stopping method for earthquake signal detection of a substrate processing apparatus according to embodiments of the present disclosure.

(S704) The controller 260 executes the transfer stopping process of the transfer mechanism to be subjected to the transfer stopping process, based on the set contents. For example, as shown in Table 38 of FIG. 4, the cycle stop that stops after the end of one unit operation is performed by the detection signal of the P wave, and the immediate stop that stops as fast as possible by the detection signal of the S wave is performed. In a case where the S wave is detected during the cycle stop after the P wave is detected, the transfer mechanism is immediately stopped. In a case where the S wave does not arrive within a predetermined time after the P wave is detected and an earthquake detection alarm is generated, the alarm is generated again. In this case, the transfer mechanism remaining in the cycle stop by detecting the P wave signal remains stopped, and a recovery operation (alarm release) may be performed manually to restart the transfer mechanism. When the alarm is released, the controller 260 may proceed to (S705) and ends the transfer stopping process sequence.

For example, in a case where a set value of a stop mechanism in the event of an earthquake in FIG. 6 is 1 and there is initial position movement of the boat in the event of the earthquake, that is, in a case where the boat elevator 54 is set to be subjected to the transfer stopping process, when the earthquake (S wave) is detected while the boat is being elevated (the boat is being raised or being lowered), the boat elevator 54 is configured to perform an operation of returning the boat 30 to its initial position when the stopping method shown in FIG. 3 is set to the "cycle stop" or "step stop."

According to the substrate processing apparatus of the embodiments of the present disclosure, it is possible to perform the transfer stopping process that does not rely on human judgment, and it is possible to detect vibrations of the P wave and the S wave and perform an appropriate transfer stopping operation.

Although the processing mechanism is not particularly set in the above-described embodiments, it is possible to set the processing mechanism to operate according to the P wave and the S wave, respectively. For example, heating by the heater unit 49 may be set to stop, regardless of the P wave and the S wave when the earthquake is detected. On the other hand, the heater unit 49 may be set to continue its operation even when the P wave is detected and to stop the operation when the S wave is detected. Further, an opening/closing valve may be set such that when the earthquake is detected, a valve configured to supply a process gas may be set to OFF and a valve configured to supply an inert gas may be set to ON, regardless of the P wave and the S wave. These are just examples, but various settings may be made arbitrarily.

Alternatively, a detection signal may be output for each earthquake intensity from the earthquake detector 300. For example, different detection signals may be output at the earthquake intensity of 4 and the earthquake intensity of 7. With this configuration, it is possible for the control part 32 to set the stopping operation of the transfer mechanism and the processing mechanism according to the earthquake intensity.

As described above, in the present disclosure, when the earthquake is detected, the transfer mechanism or the processing mechanism may be appropriately stopped. Since the subsequent restoration process is basically a restoration process after the occurrence of an earthquake, a restoration process by user, for example, boat replacement, substrate collection, and the like, is performed.

For example, an image pickup device such as a camera is incorporated in the apparatus to record the operation of the transfer mechanism such as the pod conveyor 20 and the substrate conveyor 28. Then, when receiving an earthquake detection signal from the earthquake detector 300, the controller 260 is configured to be capable of acquiring an image data of the transfer mechanism that is operating when the earthquake occurs via the network 263 and displaying the acquired image data on the input/output device 131. This makes it possible to check the operating status of the transfer mechanism until just before the occurrence of the earthquake.

For example, in a case where the transfer mechanism that is operating when the earthquake occurs is the substrate conveyor 28, a screen to check misalignment of the wafer 200 may be automatically displayed on the input/output device 131. In a case where the transfer mechanism that is operating when the earthquake occurs is the pod conveyor 20, a screen to check misalignment of the pod may be automatically displayed on the input/output device 131. That is, it is possible to know which transfer mechanism was subjected to the operation stop when the earthquake occurs from information on the operation screen, and contents of the restoration process are clarified, which contribute to shortening a time regarding the restoration process.

The present disclosure described above may be applied to a substrate processing apparatus of a semiconductor manufacturing apparatus, and to an apparatus, such as an LCD apparatus, configured to process a glass substrate, too. The film-forming process includes, for example, a CVD, a PVD, a process of forming an oxide film or a nitride film, a process of forming a film containing metal, and the like. Further, the present disclosure may be also applied to other substrate processing apparatuses, for example, an exposure apparatus, a lithography device, a coating device, a CVD apparatus in which plasma is used, and the like.

Embodiments of Present Disclosure

Hereinafter, some embodiments of the present disclosure will be additionally described as supplementary notes.
(Supplementary Note 1)

According to embodiments of the present disclosure, there is provided a substrate processing apparatus including:
- at least one transfer mechanism configured to transfer a substrate and at least one processing mechanism configured to process the substrate;
- an earthquake detector configured to detect an earthquake; and
- a controller configured to control the at least one transfer mechanism and the at least one processing mechanism according to a detection result of the earthquake detector,
- wherein the controller is configured to be capable of performing a stopping operation of the at least one transfer mechanism according to a P wave (initial tremor wave) and an S wave (principal fluctuation wave).

(Supplementary Note 2)

The substrate processing apparatus of Supplementary Note 1, wherein the stopping operation of the at least one transfer mechanism is configured to be individually set with respect to the P wave and the S wave.

(Supplementary Note 3)

The substrate processing apparatus of Supplementary Note 1, wherein the stopping operation of the at least one transfer mechanism is configured to be capable of selecting one of deceleration stop, immediate stop, step stop, and cycle stop.

(Supplementary Note 4)

The substrate processing apparatus of Supplementary Note 1, wherein the at least one transfer mechanism includes a plurality of transfer mechanisms, and wherein the stopping operation is configured to be capable of being selected with respect to each of transfer mechanisms according to the detection result from the earthquake detector.

(Supplementary Note 5)

The substrate processing apparatus of Supplementary Note 1, wherein the at least one transfer mechanism is at least one selected from the group of a pod conveyor, a substrate conveyor, a boat elevator, and a rotator.

(Supplementary Note 6)

The substrate processing apparatus of Supplementary Note 5, wherein when a stopping operation of the boat elevator of the at least one transfer mechanism is set to cycle stop, the boat elevator is configured to be capable of returning a boat to an initial position regardless of whether the boat is being raised or being lowered.

(Supplementary Note 7)

The substrate processing apparatus of Supplementary Note 5, wherein when a stopping operation of the boat elevator of the at least one transfer mechanism is not set, the controller is configured to be capable of performing a substrate processing process including a loading step, a processing step, and an unloading step even when the earthquake is detected while the boat is being raised.

(Supplementary Note 8)

The substrate processing apparatus of Supplementary Note 1, wherein the at least one transfer mechanism is configured to be capable of setting presence or absence of the stopping operation.

(Supplementary Note 9)

The substrate processing apparatus of Supplementary Note 1, wherein when the P wave is detected, the controller is configured to be capable of maintaining an earthquake detection alarm even when the S wave is not detected.

(Supplementary Note 10)

The substrate processing apparatus of Supplementary Note 1, wherein the controller is configured to be capable of selecting the stopping operation of the at least one transfer mechanism according to an earthquake intensity.

(Supplementary Note 11)

The substrate processing apparatus of Supplementary Note 1, wherein the at least one processing mechanism includes a plurality of processing mechanisms, and wherein a stopping operation is configured to be capable of being set with respect to each of the processing mechanisms.

(Supplementary Note 12)

The substrate processing apparatus of Supplementary Note 1, wherein the controller is configured to be capable of selecting an operation of the at least one processing mechanism according to the P wave and the S wave.

(Supplementary Note 13)

The substrate processing apparatus of Supplementary Note 1, wherein a stopping operation is configured to be capable of being selected with respect to each of the processing mechanisms according to the detection result from the earthquake detector.

(Supplementary Note 14)

The substrate processing apparatus of Supplementary Note 1, wherein the controller is configured to be capable of selecting a stopping operation of the at least one processing mechanism according to an earthquake intensity.

(Supplementary Note 15)

According to other embodiments of the present disclosure, there is provided a method of manufacturing a semiconductor device, the method including: a substrate transferring process of operating at least one transfer mechanism configured to transfer a substrate; a substrate processing process of operating a processing mechanism configured to process the substrate; receiving a detection signal of at least one selected from the group of an initial tremor wave and a principal fluctuation wave of an earthquake detected during execution of the substrate transferring process or the substrate processing process; and performing a stopping operation of the at least one transfer mechanism according to the received initial tremor wave and the principal fluctuation wave.

(Supplementary Note 16)

According to other embodiments of the present disclosure, there is provided a program executed by the substrate processing apparatus of Supplementary Note 1 or a computer-readable storage medium storing the program that causes the substrate processing apparatus to perform a process including: receiving at least one selected from the group of an initial tremor wave and a principal fluctuation wave of an earthquake; and performing the stopping operation of the at least one transfer mechanism according to a detection signal of the received initial tremor wave and principal fluctuation wave.

According to the present disclosure in some embodiments, it is possible to perform an appropriate transfer stopping operation by detecting vibrations of an initial tremor (P) wave and a principal fluctuation (S) wave when an earthquake occurs.

While certain embodiments have been described, these embodiments have been presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   at least one transfer mechanism that transfers a substrate;
   at least one processing mechanism that processes the substrate;
   an earthquake detector that detects a signal of at least one selected from the group of a P wave (initial tremor wave) and an S wave (principal fluctuation wave) of an earthquake; and
   a controller that controls the at least one transfer mechanism and the at least one processing mechanism according to the detected signal,
   wherein the controller:
      stores setting information that sets operations for the at least one transfer mechanism, each of which is selected from the group of a stopping operation and a no-stopping operation according to a signal to be detected by the earthquake detector;
      in response to receiving the detected signal from the earthquake detector, performs an operation among the set operations for the at least one transfer mechanism, according to the detected signal received from the earthquake detector; and
      when the performed operation is the no-stopping operation, continuously performs a substrate processing operation of the at least one processing mechanism in a case where the earthquake is detected during the substrate processing operation of the at least one processing mechanism, and
   wherein the stopping operation includes at least one selected from the group of:
      a step stop that stops the at least one transfer mechanism after an end of a single axis operation; and
      a cycle stop that stops the at least one transfer mechanism after an end of one unit operation.

2. The substrate processing apparatus of claim 1, wherein the operations for the at least one transfer mechanism are individually set with respect to the P wave and the S wave.

3. The substrate processing apparatus of claim 1, wherein the at least one transfer mechanism includes a plurality of transfer mechanisms, and
   wherein a plurality of operations are selected with respect to each of the plurality of transfer mechanisms according to the signal to be detected.

4. The substrate processing apparatus of claim 1, wherein the at least one transfer mechanism is at least one selected from the group of a pod conveyor, a substrate conveyor, a boat elevator, and a rotator.

5. The substrate processing apparatus of claim 4, wherein when an operation of the boat elevator is selected to the cycle stop as the stopping operation, the boat elevator returns a boat to an initial position regardless of whether the boat is being raised or being lowered.

6. The substrate processing apparatus of claim 4, wherein when an operation of the boat elevator is selected to the no-stopping, the controller performs a substrate processing process including a loading step, a processing step, and an unloading step even when the earthquake is detected while a boat is being raised.

7. The substrate processing apparatus of claim 1, wherein when the P wave is detected, the controller maintains an earthquake detection alarm even when the S wave is not detected.

8. The substrate processing apparatus of claim 1, wherein the controller performs the operation among the set operations for the at least one transfer mechanism according to an earthquake intensity that is indicated by the detected signal received from the earthquake detector.

9. The substrate processing apparatus of claim 1, wherein the at least one processing mechanism includes a plurality of processing mechanisms, and
   wherein the controller further stores setting information that sets an operation for each of the plurality of processing mechanisms.

10. The substrate processing apparatus of claim 1, wherein the controller further stores setting information that sets operations for the at least one processing mechanism according to the P wave and the S wave as the signal to be detected by the earthquake detector.

11. The substrate processing apparatus of claim 1, wherein the at least one processing mechanism includes a plurality of processing mechanisms, and
    wherein the controller further stores setting information that sets each operation for each of the plurality of processing mechanisms according to the signal to be detected by the earthquake detector.

12. The substrate processing apparatus of claim 1, wherein the controller further stores setting information that sets operations for the at least one processing mechanism according to an earthquake intensity as the signal to be detected by the earthquake detector.

13. A method of manufacturing a semiconductor device, comprising:
    a substrate transferring process of operating at least one transfer mechanism to transfer a substrate;
    a substrate processing process of operating at least one processing mechanism to process the substrate;
    storing setting information that sets operations for the at least one transfer mechanism, each of which is selected from the group of a stopping operation and a no-stopping operation according to a signal to be detected;
    detecting a signal of at least one selected from the group of a P wave (initial tremor wave) and an S wave (principal fluctuation wave) of an earthquake;
    in response to receiving the detected signal, performing an operation among the set operations for the at least one transfer mechanism, according to the detected signal;
    when the performed operation is the no-stopping operation, continuously performing the substrate processing process of the at least one processing mechanism in a case where the earthquake is detected during the substrate processing operation of the at least one processing mechanism,
    wherein the stopping operation includes at least one selected from the group of:
       a step stop that stops the at least one transfer mechanism after an end of a single axis operation; and
       a cycle stop that stops the at least one transfer mechanism after an end of one unit operation.

14. A non-transitory computer-readable recording medium storing a program that causes a controller to perform a process, wherein the program is executed in a substrate processing apparatus including at least one transfer mechanism that transfers a substrate, at least one processing mechanism that processes the substrate, an earthquake detector that detects a signal of at least one selected from the group of a P wave (initial tremor wave) and an S wave (principal fluctuation wave) of an earthquake, and the controller that controls the at least one transfer mechanism and the at least one processing mechanism according to the detected signal, the process comprising:

storing setting information that sets operations for the at least one transfer mechanism, each of which is selected from the group of a stopping operation and a no-stopping operation according to a signal to be detected by the earthquake detector;

in response to receiving the detected signal from the earthquake detector, performing an operation among the set operations for the at least one transfer mechanism, according to the detected signal received from the earthquake detector; and when the performed operation is the no-stopping operation, continuously performing a substrate processing operation of the at least one processing mechanism in a case where the earthquake is detected during the substrate processing operation of the at least one processing mechanism, wherein the stopping operation includes at least one selected from the group of:

a step stop that stops the at least one transfer mechanism after an end of a single axis operation; and a cycle stop that stops the at least one transfer mechanism after an end of one unit operation.

15. The substrate processing apparatus of claim 1, wherein the stopping operation further includes an immediate stop that the at least one transfer mechanism as fast as possible in response to receiving the detected signal of S wave.

16. The substrate processing apparatus of claim 1, wherein, when the performed operation is the no-stopping operation, the controller continuously performs the substrate processing operation of the at least one processing mechanism in a case where the earthquake is detected while the at least one processing mechanism is performing the substrate processing operation to process the substrate in a process chamber.

* * * * *